United States Patent
Zheng et al.

(10) Patent No.: US 7,223,629 B2
(45) Date of Patent: May 29, 2007

(54) METHOD AND APPARATUS FOR MANUFACTURING A TRANSISTOR-OUTLINE (TO) CAN HAVING A CERAMIC HEADER

(75) Inventors: Tieyu Zheng, Chandler, AZ (US); Raghuram Narayan, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/732,949

(22) Filed: Dec. 11, 2003

(65) Prior Publication Data

US 2005/0130342 A1 Jun. 16, 2005

(51) Int. Cl.
*H01L 21/44* (2006.01)
*H01L 21/48* (2006.01)
*H01L 21/50* (2006.01)

(52) U.S. Cl. .................. 438/106; 438/125
(58) Field of Classification Search .......... 438/106, 438/112, 118, 122, 125, 126
See application file for complete search history.

(56) References Cited

U.S. PATENT DOCUMENTS

| | | | | |
|---|---|---|---|---|
| 4,142,286 A | * | 3/1979 | Knuth et al. | 29/852 |
| 5,758,816 A | * | 6/1998 | Rabinovich | 228/121 |
| 5,982,038 A | * | 11/1999 | Toy et al. | 257/772 |
| 6,040,624 A | * | 3/2000 | Chambers et al. | 257/692 |
| 6,597,944 B1 | * | 7/2003 | Hadas | 600/546 |
| 6,709,898 B1 | * | 3/2004 | Ma et al. | 438/122 |
| 6,818,464 B2 | * | 11/2004 | Heschel | 438/22 |
| 2004/0114882 A1 | * | 6/2004 | Marquez et al. | 385/91 |

* cited by examiner

*Primary Examiner*—Phuc T. Dang
(74) *Attorney, Agent, or Firm*—Schwegman, Lundberg, Woessner & Kluth, P.A.

(57) ABSTRACT

A method of manufacturing an optoelectronic packaging comprises placing a solder preform between a metal cover and an insulating base, applying pressure to the metal cover and the insulating base, and applying a current through multiple conductive vias to heat the solder preform to melt.

11 Claims, 10 Drawing Sheets

METHOD AND APPARATUS FOR MANUFACTURING A TRANSISTOR-OUTLINE (TO) CAN HAVING A CERAMIC HEADER

FIELD OF THE DISCLOSURE

An optoelectronic assembly and, more specifically, a package adapted to house an optoelectronic assembly are disclosed.

BACKGROUND

Optoelectronic components or active optical devices such as diode lasers, light-emitting diodes (LEDs), and photodiode detectors are used for printing, data storage, optical data transmission and reception, laser pumps, and a multitude of other applications. Most optoelectronic components are typically sealed inside a hermetically sealed package for performance requirements and operational stability. Optoelectronic packages are intended to provide a hermetic structure to protect passive and active optical elements and devices as well as related electrical components from damage resulting from moisture, dirt, heat, radiation, and/or other sources.

For high-speed applications (e.g., 2 Gbps and above), proper operation of the optical and/or electrical components inside the package may be affected unless careful attention is paid to the packaging of these components. Standard optical module packaging such as that used in optical telecommunication applications requires a hermetic enclosure. Sealed packages are necessary to contain, protect, and electrically connect optoelectronic components. These requirements have resulted in packages that are large, costly, and more difficult to manufacture than typical electronic packages. In fact, the cost of most optoelectronic devices is mainly dominated by the package rather than the optical devices themselves.

Current designs of optoelectronic packages and associated fabrication processes are not easily adapted for automated manufacturing techniques because conventional packages for optoelectronic components such as large so-called "butterfly" packages are characterized by numerous mechanical parts (submounts, brackets, ferrules, etc.), and three-dimensional (3D) alignment requirements. Butterfly packages are basically can-and-cover type arrangements that contain an optical subassembly mounted to a metallic baseplate, with leads coming out of the sides for electrical connections. The optical subassembly may be built up separately, outside of the can, and then later installed in the can. The circuits within the optical subassembly are wire-bonded to the leads of the butterfly can, which is then sealed with a lid to create a hermetic enclosure. Unfortunately, conventional butterfly cans are bulky, costly, and time-consuming to manufacture. In addition, the electrical components require a separate electrical subassembly that is located outside of the butterfly can. The requirement of a separate electrical subassembly that is separate and apart from the optical subassembly inside the butterfly can increases manufacturing costs significantly.

Transistor-Outline (TO) packages are also commonly used to house optoelectronic components. Conventional TO packages include a generally cylindrical metal cap and a metal header or base, to which the metal cap is attached. In such packages, metal-based bonding techniques such as, for example, brazing or fusion welding, are often used to provide a hermetic seal between the metal cap and the header. To weld the metal cap onto the header, the header is typically formed of a metallic material such as Kovar™ or stainless steel.

In addition, when active optical devices (e.g., diode lasers) and integrated circuits adapted to control the active optical devices (e.g., diode drivers) are spaced too far apart from each other, parasitic capacitance, resistance, and/or inductance may affect electrical signals traveling between the components, thus resulting in degradation of the electrical signal. The electrical performance is of particular concern for high-speed applications. Consequently, electrical performance may be improved during high-speed applications when the distance between the active optical device and its associated driving or receiving integrated circuit chip is as short as possible. Although this arrangement improves the electrical signal integrity, it increases heat dissipation requirements of the assembly significantly.

As the power density increases in optoelectronic devices and/or electrical components used in high-speed applications, a suitable, optimal heat sink is necessary to dissipate heat efficiently from the optoelectronic device and/or electrical components. Heat sinks are devices capable of dissipating heat away from the optoelectronic and/or electrical components into the surrounding atmosphere by convection. Typical heat sinks include cooling fins attached to a heat sink base that is in contact with the header or base of the optoelectronic package. The fins of the heat sink may have any shape and size necessary to spread heat away from the optoelectronic device and/or electrical components, and may be oriented either parallel or perpendicular relative to the base of the optoelectronic package.

Commercially available heat sinks are generally square or rectangular in shape. As such, the circular headers of conventional optoelectronic packages require either modifications to the structural design of the heat sinks to be able to accommodate the circular headers, or manufacturing adjustments to attach the circular header to the square or rectangular heat sink. This configuration results in a complex, slow, and expensive manufacturing process. Additionally, the quality of the contact between the optoelectronic package and the attached heat sink has a great impact on the overall thermal performance. Lower thermal impedance between the optoelectronic package and the heat sink results in higher conductive heat transfer. Therefore, it is advantageous that the header of the optoelectronic package be in intimate, conformal contact with the attached heat sink to optimize the thermal characteristics, which results in increased efficiency.

Moreover, existing optoelectronic packaging techniques often involve manual or semi-automated manufacturing processes. Therefore, to reduce manufacturing costs, it is advantageous to employ automated batch packaging processes that can fabricate a large number of optoelectronic packages simultaneously.

Therefore, there is a need for an improved optoelectronic package and a process for making the optoelectronic package that can address some or all of the problems described above.

BRIEF DESCRIPTION OF THE DRAWINGS

FIG. 9 is an exploded view. FIG. 10 is a cross-sectional view, and FIG. 11 is a 3-dimensional view indicating contact points for electrodes.

FIG. 20 shows in exploded view a schematic diagram of the components of the TO can. FIG. 21 shows first electrode and second electrode coupled to the TO can of FIG. 20.

DESCRIPTION OF THE PRESENTLY PREFERRED EMBODIMENTS

Figure 1:
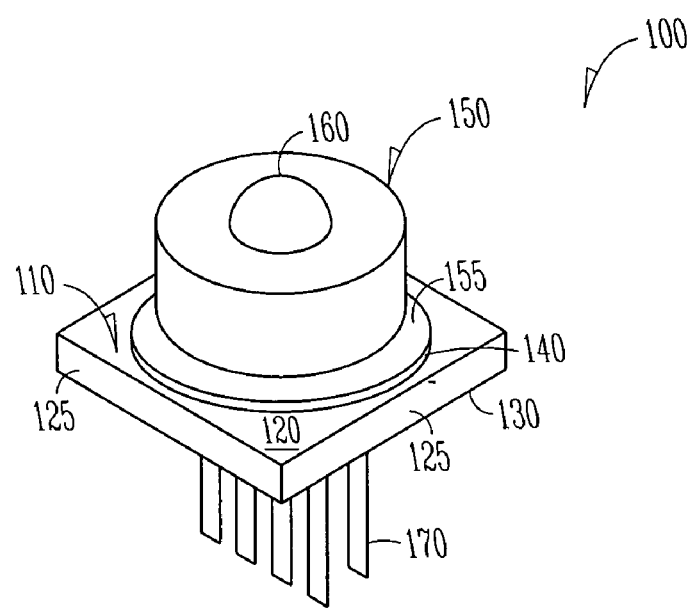
FIG. 1 is a perspective view of a package for housing an optoelectronic assembly in accordance with the teachings of the present disclosure.

Referring to FIG. 1, a package 100 for housing an optoelectronic assembly is shown. The package 100 includes an insulating base or substrate 110, a metal sealing member 140, and a metal cap 150. In one embodiment, the insulating base 110 is formed of a material with good thermal conductivity for directing dissipated heat away from the optoelectronic assembly. By using a high thermal conductivity material, the insulating base 110 is capable of effectively dissipating the heat of active optical devices, e.g., diode lasers, and can incorporate integrated circuits, e.g., diode driver chips, into the optoelectronic package 100. In the past, these integrated circuit chips have not been integrated into the optoelectronic package 100 because the thermal conductivity of the metallic header of conventional optoelectronic packages was unsuitable for mounting such chips. As discussed in greater detail below, the integrated optoelectronic package 100 of the present disclosure, which includes the active optical device 200 and its associated integrated circuit 220 (see FIGS. 4a and 4b) provides a high-speed module that saves power, space, and costs without sacrificing reliability and performance.

Suitable materials for the insulating base 110 include ceramics such as alumina, beryllium oxide (BeO), and aluminum nitride (AlN). The insulating base 110 includes an upper surface 120, a lower surface 130, and four substantially flat sidewalls 125 (only two of which are shown) extending downwardly from the upper surface 120. The thickness of the insulating base 110 may be approximately 1 mm. Of course, it should be understood that the insulating base 110 could be thicker or thinner as desired.

As shown, both the upper and lower surfaces 120, 130 of the insulating base 110 are substantially planar. It is well-known that mounting techniques using planar substrates such as, for example, pick-and-place techniques are well-suited to high-volume manufacturing. In addition, because overall mechanical stability is directly related to the stability of the base 110, the substantially planar upper surface 120 of the optoelectronic package 100 provides good mechanical stability. Furthermore, by using ceramics for the base 110, optimal mechanical stability may be obtained.

Due to the polygonal shape (e.g., square or rectangular) of the insulating base 110, the contact at the mating, heat-conducting surface of the insulating base 110 and a commercially available square or rectangular-shaped heat dissipating device (not shown) is improved. Preferably, the heat dissipating device is a heat sink. However, other types of heat dissipating devices such as, for example, heat pipes are equally applicable. In this manner, the polygonal shape of the insulating base 110 provides sufficient thermal contact and coupling with a polygonal-shaped (e.g., square or rectangular) heat sink, thereby improving the heat transfer characteristics therebetween. In addition, the substantially flat sidewalls 125 provide a greater heat dissipation area because the heat generated by the optoelectronic and/or electrical components housed within the package 100 may be conducted to the substantially flat sidewalls 125. As a result, heat dissipation efficiency is increased. Furthermore, the high thermal conductivity of the ceramic material of the insulating base 110 makes it possible to efficiently extract the heat produced by the optoelectronic device and/or electrical components.

Besides the thermal advantage of using an insulating substrate header, the insulating substrate header provides for better impedance matching. In order to reduce insertion loss and back reflection, it is important for an optoelectronic device to have an impedance that matches its interfacing electrical components, such as a transimpedance amplifier (TIA) or other electronic component. By using an insulating substrate header, such as a multi-layer ceramic base, the impedance of the TO can can be designed to have the desired impedance. In contrast, in prior art devices that use a metal header and wire bonds, it is more difficult to design a matching impedance particularly at high speeds.

Figure 2:
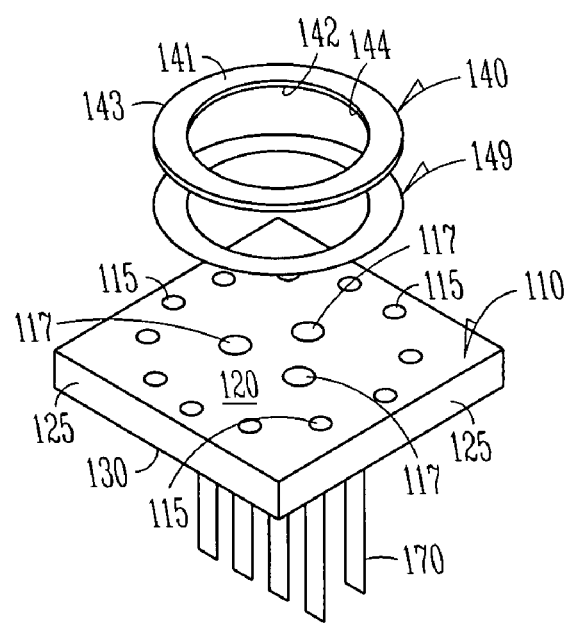
FIG. 2 is an exploded view of the insulating base having a plurality of holes that are filled with a conductive material formed therein, a metal sealing member adapted to be secured to the insulating base, and an adhesive layer located between the metal sealing member and the insulating base.

With reference to FIG. 2, a first plurality of holes or vias 115 is formed through the insulating base 110 by, for example, a mechanical drilling process or a laser machining process. In one example, the diameter of each hole 115 is half the thickness of the insulating base 110. Of course, the diameter could be larger or smaller than this diameter as desired. In addition, the spacing between two holes 115 is approximately twice the diameter of the holes 115. The holes 115 are adapted to conduct welding current from the metal cap 150 to the insulating base 110 during a welding operation to hermetically seal the metal cap 150 to the insulating base 110. As shown, each of the plurality of holes 115 is generally circular in shape, and is formed into a generally circular configuration. However, the holes 115 may have other shapes as well. For example, the holes 115 may be oval, square, rectangular, octagonal, etc. in shape. Likewise, the plurality of holes 115 may be formed into other geometric configurations such as, for example, ovals, squares, rectangles, etc. Lastly, although twelve holes 115 are shown, any desired number of holes 115 may be provided.

A second plurality of holes or vias 117 may be formed through the insulating base 110, and located within an inner region of the first plurality of holes 115. The second plurality of holes or signal vias 117 are adapted to electrically connect signals from the upper surface 120 of the insulating base 110 to the lower surface 130 of the insulating base 110.

The insulating base 110 also includes a conductive material layer (not shown), deposited on both the upper and lower surfaces 120, 130 of the insulating base 110. The conductive material layers may be deposited using physical vapor deposition (PVD) techniques such as evaporation, sputtering, screen printing, or other suitable processes. The conductive material may include a metal such as, for example, copper, gold, tin, a copper/tin alloy, tungsten, lead, nickel, palladium, or any other similar metal. In one example, the metal layers on each of the upper and lower surfaces 120, 130 of the insulating base 110 include a thick film metallization that is capable of being soldered or brazed. In other words, the metal layers include films with a thickness of greater than approximately 10 µm. If desired, however, the metal layers may include a thin film metallization. In any event, the thickness of the metal layers is based, in part, on the requirements for brazing or soldering of the metal sealing member 140 to the upper surface 120 of the insulating base 110.

The first plurality of holes 115 and the second plurality of holes 117 are, likewise, substantially filled with the same or similar electrically conductive material as that deposited on the upper and lower surfaces 120, 130 of the insulating base 110. For example, the first plurality of holes 115 and the second plurality of holes 117 may be filled with flowable solder, or screen-filled using a paste of conductive material such as, for example, copper and/or tungsten. A metal contact member (not shown) may be attached to the lower metallized surface 130 of the insulating base 110 via an adhesive layer (e.g., a brazing paste or a solder preform layer) disposed between the metal contact member and the lower surface 130 of the insulating base 110. The metal contact member is adapted to contact each of the first plurality of filled holes 115 at the lower surface 130 of the insulating base 110. The metal contact member may be sufficiently etched, grinded, and/or polished to provide a substantially flat contact surface at the lower surface 130 of the insulating base 110.

The insulating base 110 may be configured as a multilayer substrate having a plurality of levels. Multiple metal layers may be provided at each of the plurality of levels, and joined together (e.g., laminated) on the insulating base 110. In this configuration, the second plurality of holes 117 may be formed in the layers so that signals can be communicated between the adjacent layers.

The metal layers deposited on the upper and lower surfaces 120, 130 of the insulating base 110 may be patterned to include a plurality of electrically conductive paths or traces (not shown). The metallized pattern on the upper and lower surfaces 120, 130 and any of the intermediate layers of the insulating base 110 may be formed by photolithography, stamping, electroplating, etching, electro-discharge machining, or other similar techniques. The optical devices and/or electrical components may be mounted to and electrically connected to the conductive metallized pattern on the upper surface 120 of the insulating base 110.

At least one electrical lead 170 is attached, such as by brazing, to the lower metallized surface 130 of the insulating base 110, and is connected to the upper metallized surface 120 of the insulating base 110 via the second plurality of filled holes 117. The electrical leads 170 are adapted to communicate signals from the optoelectronic and/or electrical components housed inside the package 100 to components located external to the package 100 on a printed circuit board, for example. The leads 170 may be circular or rectangular in cross-section. Preferably, the electrical leads 170 are arranged as an array of leads 170, and may be located at any location on the lower surface 130 of the insulating base 110. The insulating base 110 may be operatively coupled to sockets in the printed circuit board (not shown) via the electrical leads 170. Alternatively, the insulating base 110 may be operatively coupled to the printed circuit board using solder connections such as, for example, ball grid array connections and/or a flex circuit.

Figure 3:
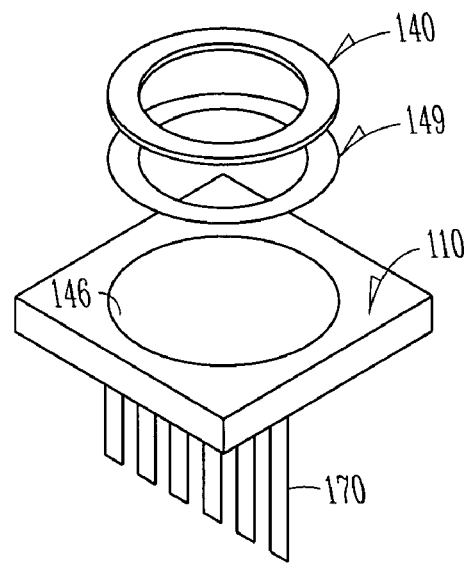
FIG. 3 is an exploded view of the insulating base with the plurality of filled holes covered by a metal layer, the adhesive layer, and the metal sealing member.
Figure 11:
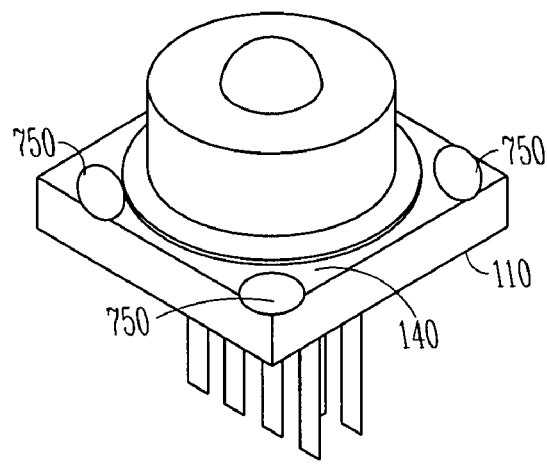
Figure 17:
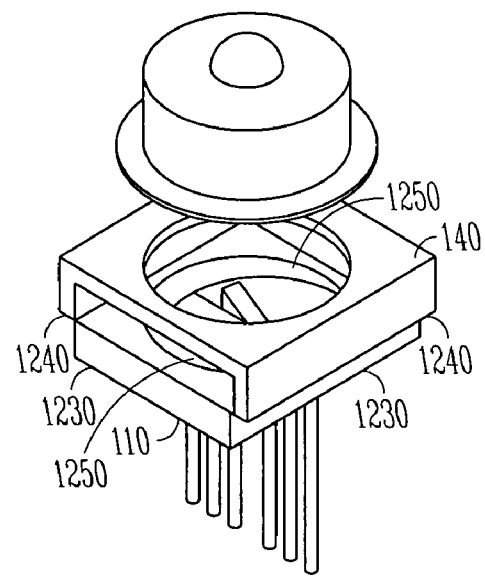
FIG. 17 illustrates in exploded view another embodiment of a metal frame that overhangs the insulating base.

With reference to FIGS. 2 and 3, the metal sealing member 140 may be sealably attached to the upper metallized surface 120 of the insulating base 110 using an adhesive layer 149 disposed between the metal sealing member 140 and the upper surface 120 of the insulating base 110. As shown in FIG. 3, the metal layer on the upper surface 120 of the insulating base 110 may be etched, grinded, and/or polished to provide a substantially flat contact surface for attachment of the metal sealing member 140, also called metal ring frame 140. The metal sealing member 140, which may be formed of Kovar™ or any other similar metallic material, includes a top wall 141, a bottom wall 142, an outer wall 143, and an inner wall 144. Preferably, the metal sealing member 140 is a sealing ring having a generally circular cross-sectional shape between the outer wall 143 and inner wall 144. However, the metal sealing member 140 may have other shapes as well. For example, the metal sealing member 140 may have a generally oval cross-sectional shape between the outer wall 143 and inner wall 144. Still further, the metal sealing member 140 may have a polygonal shape such as a rectangular cross-sectional shape or a square cross-sectional shape between the outer wall 143 and inner wall 144. Additionally, the outer wall of the metal sealing member 140 may extend to the upper surface perimeter of the insulating base 110, as shown in FIG. 11. The metal sealing member 140 may also extend over one or more side walls of the insulating base 110, as shown in FIG. 17.

The adhesive layer 149, which is basically a wafer-sized prefabricated bond, is disposed on the upper surface 120 of the insulating base 110. The adhesive layer 149 may include a brazing paste of, e.g., copper and/or silver, or a solder preform layer 149 formed of metal (e.g., a gold or tin preform). The bottom wall 142 of the metal sealing member 140 is then positioned on the adhesive layer 149 on the upper surface 120 of the insulating base 110. Through appropriate use of a brazing heat operation, the metal sealing member 140 is bonded to the upper surface 120 of the insulating base 110.

Referring back to FIG. 1, a cover 150, such as one formed of Kovar™ or other suitable metal, is then hermetically sealed to the top wall 141 of the metal sealing member 140 to contain and fully enclose the optoelectronic and electrical components mounted to the upper surface 120 of the insulating base 110, and to thereby seal off the module package 100. Use of such a hermetically sealed cover 150 acts to keep out moisture, corrosion, and ambient air to therefore protect the generally delicate optoelectronic and electrical components housed inside the package 100.

Typically, the metal cap 150 is circular or cylindrical in shape. However, the metal cap 150 may have a square or rectangular shape instead. The metal cap 150 may include a lower peripheral edge or rim 155 having a shape that is generally complementary to the shape of the metal sealing member 140 so that the rim 155 of the metal cap 150 can be hermetically sealed to the top wall 141 of the metal sealing member 140. For example, the lower rim 155 of the metal cap 150 may be generally circular when the metal sealing member 140 has a generally circular cross-sectional shape between the outer wall 143 and inner wall 144. Likewise, the lower rim 155 of the metal cap 150 may be generally rectangular when the metal sealing member 140 has a generally rectangular cross-sectional shape between the outer wall 143 and inner wall 144. By enclosing and hermetically sealing the metal cap 150 to the insulating base 110, the optoelectronic and electrical components housed within the package 100 are kept in a controlled gaseous environment that protects them and prevents degradation in their performance and/or lifetime.

As shown in FIG. 1, the rim 155 of the metal cap 150 may be set back from the outer wall 143 of the metal sealing member 140. Alternatively, the rim 155 of the metal cap 150 may be substantially flush with the outer wall 143 of the metal sealing member 140. As discussed in more detail below, a hermetically sealed attachment of the metal cap 150 to the metal sealing member 140 on the insulating base 110 may be established by, for example, seam welding, laser welding, resistance welding, soldering, etc.

The metal cap 150 includes a transparent portion 160 such as, for example, a flat glass window, ball lens, aspherical lens, or GRIN lens. The optoelectronic components are mounted to the insulating base 110 within the package 100 in a manner such that light is able to pass to or from them through the transparent portion 160. Typically, the transparent portion 160 is formed of glass or plastic. To avoid effects on the optoelectronic and electrical components housed within the package 100, the transparent portion 160 of the cover 150 may be provided with an anti reflection coating to reduce optical loss and back-reflection. In one embodiment, the transparent portion 160 of the metal cap 150 is aligned with the beam emergence side of the optoelectronic device 200, such as a light generation device, so that the optoelectronic device 200 can be optically coupled to external components such as, for example, an optical fiber or any element that requires optical alignment with other optical devices, through the transparent portion 160. Alternatively, the optoelectronic device 200 may be a photodetector, in which case, the optoelectronic device 200 is aligned to receive an optical signal through the transparent portion 160 of the metal cap 150.

Figure 4A:
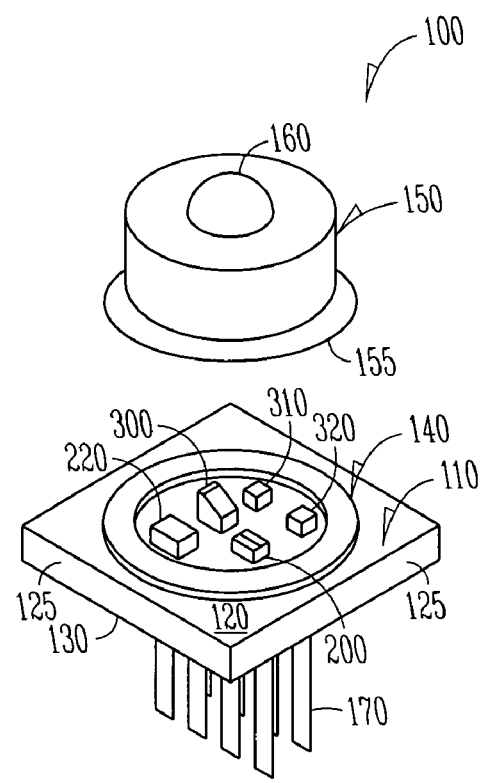
FIG. 4a is an exploded view illustrating the optoelectronic package populated with optoelectronic, optical, and electrical components in accordance with a first embodiment.
Figure 4B:
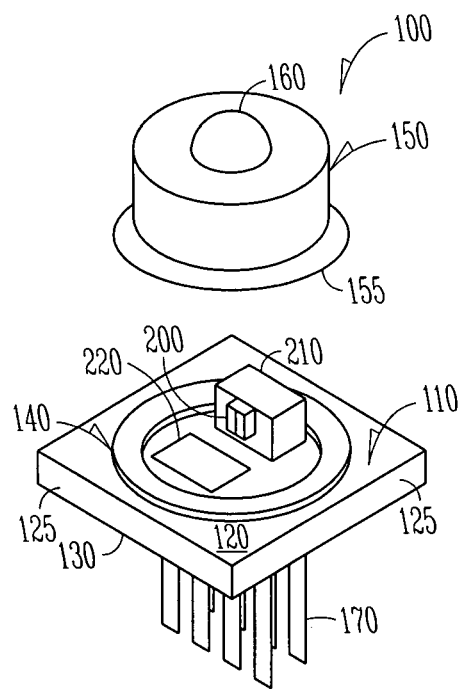
FIG. 4b is an exploded view illustrating the optoelectronic package populated with optoelectronic and electrical components in accordance with a second embodiment.

Referring to FIGS. 4a and 4b, the insulating base 110 may form the bottom of the package 100, thus making a completely self-contained package 100. Alternatively, the insulating base 110 may include one or more submounts 210 that carry the optoelectronic and/or electrical components. In other words, the optoelectronic and/or electrical components may be mounted directly to the upper surface 120 of the insulating base 110 (FIG. 4a), or may be mounted to submounts 210 that are attached to the insulating base 110 (FIG. 4b).

With particular reference to FIG. 4a, an active optical device 200 and its associated integrated circuit chip 220, a passive optical device 300, and various other electrical components 310, 320 are located within an inner region of the metal sealing member 140. As is well-known, these optical and/or electrical components may be mounted to the upper surface 120 of the insulating base 110 by pick-and-place techniques commonly used in the electronics industry, and attached to the insulating base 110 by adhesive bonding, soldering, gluing, or other similar method. Because the insulating base 110 is substantially planar, the pick-and-place automation may use relatively simple machine vision for accurate placement and alignment of the various components.

As shown in FIG. 4a, the insulating base 110 serves as both a mounting surface for the various optical and/or electrical components as well as the bottom or header of the package 100 itself. As a result, a higher-performance and cost-effective enclosure may be realized. In particular, the package 100 may be assembled in a relatively uncomplicated manner by simply attaching the metal cap 150 to the base 110 upon which the optoelectronic components are mounted to thereby create a hermetic enclosure. Thus, the manufacturing process may be automated, and requires a minimum number of materials and manufacturing steps.

To ensure low parasitic effects (e.g., inductance, capacitance, and/or resistance) and reduced interconnect lengths for enhanced electrical performance, it is advantageous to mount the active optical device 200 and the integrated circuit 220 close to each other inside the package 100. As a result, higher performance may be achieved in smaller packages at low cost. This configuration is particularly advantageous for high-speed applications because extraneous wiring that may limit the high-speed operation of the optoelectronic package 100 is eliminated.

Optically active devices 200 include any well known or future devices that generate light when stimulated, that sense light, convert light to electrical signals, or that condition light. For example, active optical devices 200 may include light emitters (e.g., vertical cavity surface-emitting lasers (VCSEL), Fabry-Perot (F-P) lasers, distributed-feedback (DFB) lasers, light emitting or sensing diodes, and the like), light sensors (e.g., photodetectors), and optical modulators. The integrated circuit 220 is any chip suitable for applying an electrical signal to the active optical device 200 to activate and control the device 200 such as, for example, a microprocessor, a driver chip for a transmitter device, or a transimpedance amplifier chip for a receiver device. Implementation of the microprocessor, driver, or transimpedance amplifier integrated circuit 220 is well known, and thus will not be further described.

In addition to the active optical device 200 and its associated integrated circuit 220, other optical and/or electrical components such as a mirror 300, thermistor 310, capacitor 320, etc. may be mounted to the insulating base 110 and housed inside the package 100. It is to be understood, however, that other optical and/or electrical devices besides those mentioned above may be mounted to the insulating base 110 as well.

As shown in FIG. 4a, the path of rays of the active optical device 200, e.g., a diode laser, radiates in a direction that is parallel to the plane of the upper surface 120 of the insulating base 110. Because the laser light should pass through the transparent portion 160 located at the top of the metal cap 150, the active optical device 200 is routed through a passive optical device, e.g., a mirror 300, located at the beam emergence side of the active optical device 200. The mirror 300 functions to deflect the light incident onto the mirror 300 so that the light from the diode laser 200 is able to pass through the transparent portion 160 of the metal cap 150. Although the electrical components 310, 320 are shown as being housed inside the optoelectronic package 100 in FIG. 4a, one or more of the electrical components 310, 320 may be located external to the optoelectronic package 100.

In a second embodiment shown in FIG. 4b, one or more pedestals 210 may be mounted to the upper surface 120 of the insulating base 110. The pedestal 210 may be made of a high thermally conductive material such as, for example, copper tungsten, aluminum nitride, beryllium oxide, and boron nitride. The pedestal 210 may be mounted to the upper surface 120 of the insulating base 110 by, for example, soldering, brazing, gluing, etc., or may even be an integral, raised portion of the insulating base 110 itself. The pedestal 210 may include wraparound metal paths or traces, and conducting vias formed therein. The wraparound metal paths and conducting vias connect signals from components mounted to the pedestal 210 to components mounted to the insulating base 110. In addition, the pedestal 210 may be configured as a multilayer submount 210 having a plurality of levels laminated and electrically-connected together. A separate submount (not shown), such as a ceramic or silicon to carry optical or electrical components, may be mounted on the pedestal 210, although the scope of the invention is not limited in this respect.

In this embodiment, the active optical device 200 is mounted to the pedestal 210 and oriented such that the path of rays radiates in a direction that is perpendicular to the plane of the upper surface 120 of the insulating base 110. The metal cap 150 is then attached to the insulating base 110 with the transparent portion 160 over the beam emergence side of the active optical device 200. Although only one optical device 200 is shown mounted to the pedestal 210 in FIG. 4b, it is to be understood that other optical and/or electrical components may be premounted to the submount 210 to form a subassembly. This subassembly may be incorporated with the integrated circuit 220 inside the optoelectronic package 100 to form a complete module. It should be noted that an optical or optoelectronic device "mounted on the insulating base" should be interpreted to mean mounted on the insulating base directly or mounted indirectly to the insulating base via one or more submounts.

Figure 5:
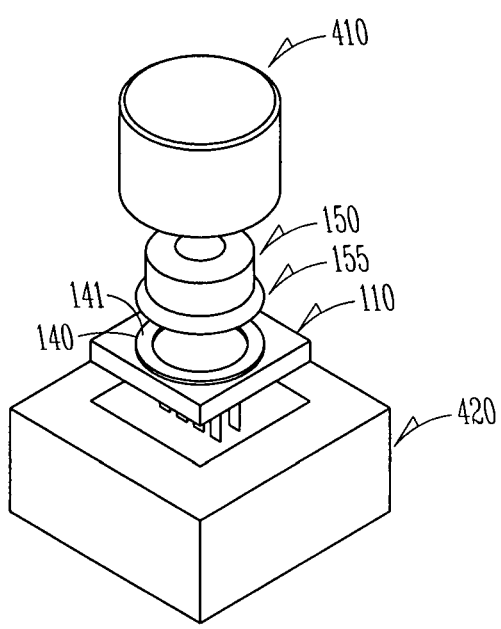
FIG. 5 is an exploded view illustrating an exemplary welding apparatus adapted to weld the metal cap to the metal sealing member attached to the insulating base.
Figures 6, 7:
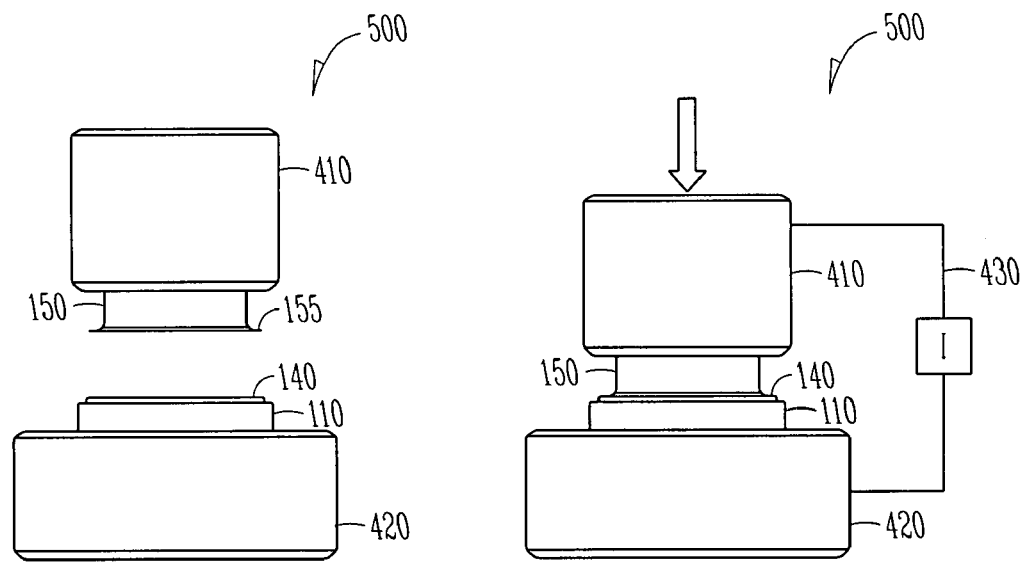
FIG. 6 is a front view illustrating the exemplary welding apparatus before the metal cap is welded to the metal sealing member attached to the insulating base.
FIG. 7 is a front view illustrating the exemplary welding apparatus during a welding operation to weld the metal cap to the metal sealing member attached to the insulating base.

With reference to FIGS. 5–7, a welding apparatus 500 adapted to weld the metal cap 150 to the metal sealing member 140 on the insulating base 110 to form the optoelectronic package 100 is disclosed. As shown in FIG. 5, the metal cap 150 is abutted against the top wall 141 of the metal sealing member 140. The lower peripheral rim 155 of the metal cap 150 is adapted to mate with the top wall 141 of the metal sealing member 140. A hermetic airtight seal is obtained by welding the lower rim 155 of the metal cap 150 to the top wall 141 of the metal sealing member 140.

During the welding process, the two metallic surfaces of the rim 155 of the metal cap 150 and the metal sealing member 140 are brought into contact with heat and pressure. This results in the sharing of atoms between the metallic components to form a mechanical bond. Resistance welding is a well-known welding technique for joining two metallic components. In its simplest form, resistance welding is the fusion of metals by controlled heat or current and, in some cases, pressure or force. During a resistance welding process, fusion of metals is produced by the heat obtained from resistance of the metallic components to electric current in a circuit or current path 430 of which the metallic components are a part, and by the application of pressure to the metallic components by electrodes. The current path 430 travels through the metallic components between a pair of opposed electrodes 410, 420. The advantages of resistance welding include its versatility and the speed and ability to automate the welding process. Specifically, with one-shot projection resistance welding, simplified to "projection welding" within this application, the weld is completed in a single shot within milliseconds.

FIG. 6 illustrates an exemplary welding apparatus 500 adapted to weld the metal cap 150 to the metal sealing member 140 attached to the insulating base 110. At least two electrodes 410, 420 are provided to hold the metallic components together during the welding process. Specifically, during a resistance welding process, two metallic components (i.e., the metal cap 150 and the metal sealing member 140 attached to the insulating base 110) are compressed together between the upper and lower electrodes 410, 420 for a predetermined period of time. Either the first electrode 410 or the second electrode 420 may apply the necessary force to weld the metallic components together.

Upon reaching the desired force, a predetermined current is applied to the metal cap 150, the metal sealing member 140, and the first plurality of filled holes 115 formed in the insulating base 110 via the first and second electrodes 410, 420. As shown in FIG. 7, the first and second electrodes 410, 420 are adapted to supply the required current through the metal cap 150, the metal sealing member 140, and the first plurality of filled holes 115 formed in the insulating base 110 for a predetermined period of time to form a weld nugget to weld the metallic components together. The amplitude and time of the welding current may be controlled by a control system (not shown).

The resistance of the metal cap 150 and metal sealing member 140 attached to the insulating base 10 produces sufficient heat to create a fusion between the metals, i.e., until a liquid molten pool of material from the metals forms at an interface between the metal cap 150 and the metal sealing member 140 attached to the insulating base 110. A predetermined amount of force is applied to control the molten area and ensure proper union.

The first and second electrodes 410, 420 maintain the metal cap 150 in contact with the insulating base 110 during the welding operation as the weld nugget is formed. Particularly, after the current is applied to the metal cap 150, the metal sealing member 140, and the first plurality of filled holes 115 formed in the insulating base 110, the components are allowed to cool so that the liquid molten pool at the interface of the components solidifies to form the weld nugget.

The welding parameters, i.e., the force, current, time, etc., may depend on the thickness of the metallic components being welded together, the resistance of the current path 430, the size of the desired weld nugget, the melting temperature(s) of the metallic components, and so forth. Moreover, any device capable of providing a welding current may be used such as, for example, a control system, a capacitor discharge system, etc. Furthermore, although the metal cap 150 is welded to the insulating base 110 using projection resistance welding due to its ability to produce high-volume output, other welding techniques could be used such as, for example, seam welding, laser welding, and other types of hermetic welding. Still further, any of a variety of welding structures capable of providing movement of one or more electrodes to provide pressure to components may be utilized such as, for example, a rocker arm welder, C-frame welder, press welder, automatic welder, robotic welder, etc.

Figure 8:
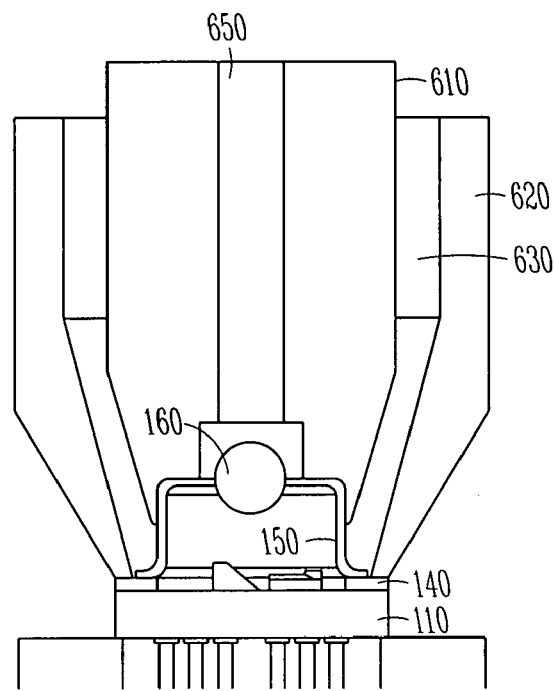
FIG. 8 illustrates a first example of an alternative welding apparatus that does not supply current through metallic vias in the insulating base to effect the hermetic seal.

FIG. 8 illustrates a first example of an alternative welding apparatus that does not supply current through metallic vias in the insulating base to effect the hermetic seal. Instead, a first electrode 610 is applied to the metal cap 150, and a second electrode 620 is applied to the metal sealing member 140. In one embodiment, the first and second electrodes are concentric and may be separated by an air gap or an insulating material 630. If active alignment of the optoelectronic package prior to projection resistance welding is desired, this may be achieved by optically aligning channel 650 with the transparent portion 160 of the metal cap 150, the optoelectronic device 200 and/or mirrors inside the optoelectronic package.

Figure 19:
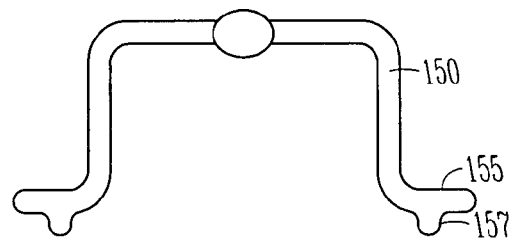
FIG. 19 is a cross section view of a metal cap illustrating a projection on its rim.

In one embodiment, the upper surface 120 of the insulating base 110 includes a conductive material layer (not shown) as was described with respect to FIG. 2. A metal sealing member 140 sits above the upper surface 120 of the insulating base 110, and an adhesive layer 149 may be disposed between the metal sealing member 140 and the upper surface 120. In one embodiment, the metal cap 150 may include on the underside of its rim 155 a sharpened point of contact, the projector 157, that rests upon the metal sealing member 140, as shown in cross section in FIG. 19. The projection 157 provides a larger resistance at the contact point than would a contact between two flat surfaces. During projection welding the projection deforms to produce a weld nugget.

During welding a pressure of up to 250 pounds is applied. The insulating base 110 may comprise ceramic which is brittle and may crack if pressure is applied directly to it. The metal sealing member 140 is ductile and reduces the stress on the ceramic. The metal sealing member 140 helps to provide a uniform weld current for a uniform hermetic seal.

Figure 9:
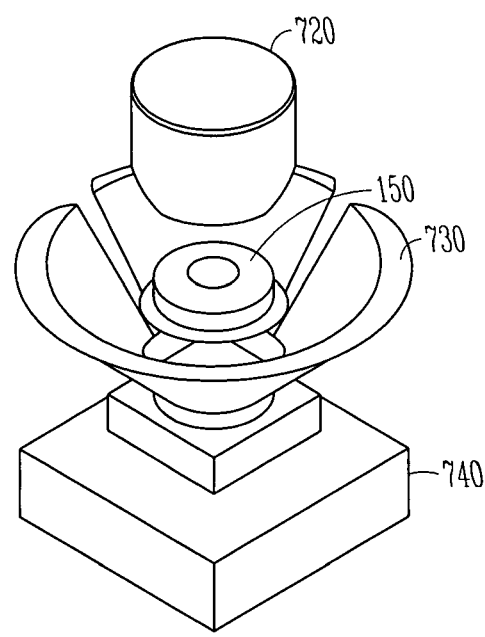
FIGS. 9, 10 and 11 illustrate a second example of a welding apparatus that supplies current between the metal cap 150 and the metal sealing member 140 to effect a hermetic seal.
Figure 10:
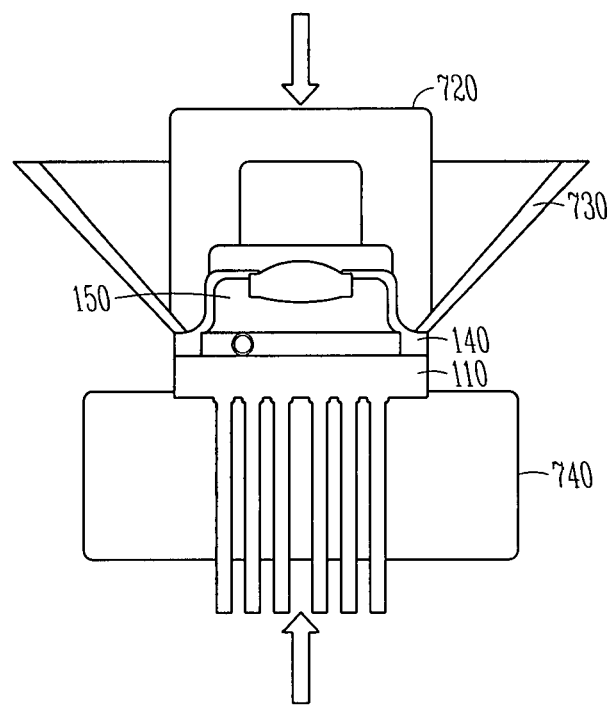

FIGS. 9, 10 and 11 illustrate a second example of a welding apparatus that supplies current between the metal cap 150 and the metal sealing member 140 to effect a hermetic seal. In this embodiment, a first electrode 720 is applied to the metal cap 150, and a second electrode 730 is applied to the metal sealing member 140. FIG. 10 shows force being applied to the first electrode 720 to hold the metal cap 150, metal sealing member 140, and insulating base in place during the welding process. In one case a support base 740 provides a counter force to that applied by the first electrode 720.

The second electrode 730 may comprise multiple fingers that contact the metal sealing member 140 at multiple points. For example, FIG. 11 shows an example of corners of the metal sealing member 140 as being possible points 750 at which the second electrode 730 may be applied. In one embodiment, the fingers of the second electrode are independently positionable. Moreover, the current provided to the multiple fingers may be independently adjustable.

Figure 12A:
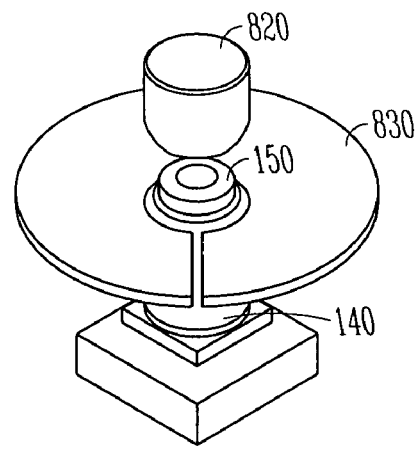
FIGS. 12A and 12B are exploded views illustrating a third example of a welding apparatus that supplies current between the metal cap and the metal sealing member to effect a hermetic seal.
Figure 12B:
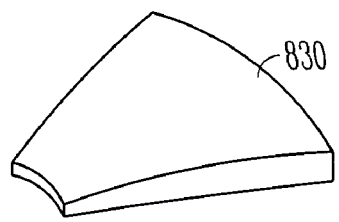

FIGS. 12A and 12B are exploded views illustrating a third example of a welding apparatus that supplies current between the metal cap 150 and the metal sealing member 140 to effect a hermetic seal. A first electrode 820 is applied to the metal cap 150, and a second electrode 830 is applied to the metal sealing member 140. In one embodiment, the second electrode 830 has multiple fingers and contacts the metal sealing member 140 at locations that substantially form a perimeter that encircles the metal cap 150.

FIG. 12B shows more clearly a single finger of the second electrode 830. Although the entire second electrode could be implemented as a single piece, using independently positionable multiple fingers may provide better uniform contact with the metal sealing member 140. Current may be independently adjustable to the multiple fingers as previously mentioned with respect to FIGS. 9, 10 and 11.

Figure 13A:
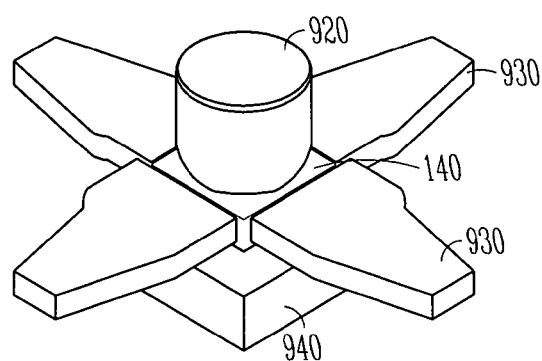
FIG. 13A illustrates a fourth example of a welding apparatus that supplies current between the metal cap and the metal sealing member to effect a hermetic seal.

FIG. 13A illustrates a fourth example of a welding apparatus that supplies current between the metal cap 150 and the metal sealing member 140 to effect a hermetic seal. A first electrode 920 is placed on the metal cap 150, and multiple fingers of a second electrode 930 are placed against side walls of the metal sealing member 140.

Figure 13B:
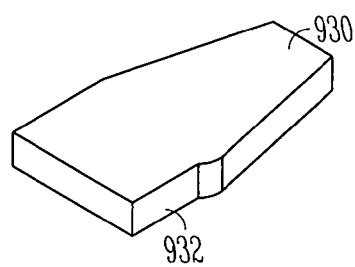
FIG. 13B shows more clearly a single finger of the second electrode of FIG. 13A.

FIG. 13B shows more clearly a single finger of the second electrode 930. In one embodiment, a rubber surface 932 lines a bottom face of the finger. The rubber surface 932 provides a non-conductive cushion that helps protect the insulating base 110 from applied stress and provides a support that rests upon support base 940 to help position the finger. In one embodiment, current in each of the multiple fingers may be controlled independently to yield a uniform current for the hermetic welding.

Figure 14:
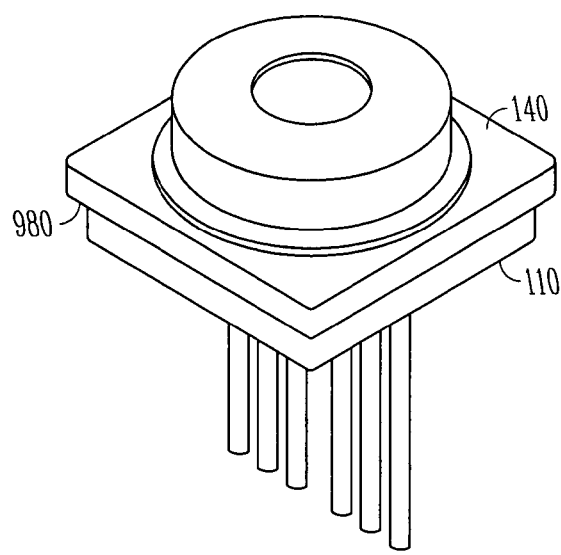
FIG. 14 illustrates another embodiment of a TO can suitable for hermetic welding.
Figure 15:
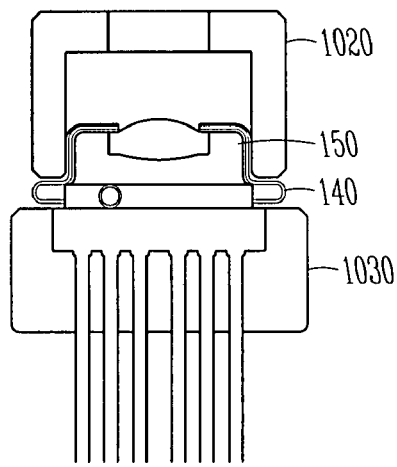
FIG. 15 shows an example cross section of a first electrode placed over the metal cap, and a second electrode holding the optoelectronic package from below and making contact along the bottom periphery of the metal sealing member.

FIG. 14 illustrates another embodiment of a TO can suitable for hermetic welding. In this embodiment, the metal sealing member 140 overhangs the top surface perimeter of the insulating base 110. In one case the metal sealing member 140 overhangs the top surface perimeter of the insulating base 110 at least partially over each of the side edges of insulating base 110. This structure allows for an electrode to be applied from the bottom side 980 of the overhanging portion of the metal sealing member 140, thus allowing current projection welding machines to be used with new tooling. FIG. 15 shows an example cross section of a first electrode 1020 placed over the metal cap 150, and a second electrode 1030 holding the optoelectronic package from below and making contact along the bottom periphery of the metal sealing member 140. As described previously, current is supplied between the two electrodes to form a hermetic welding between the metal cap 150 and the metal sealing member 140.

Figure 16:
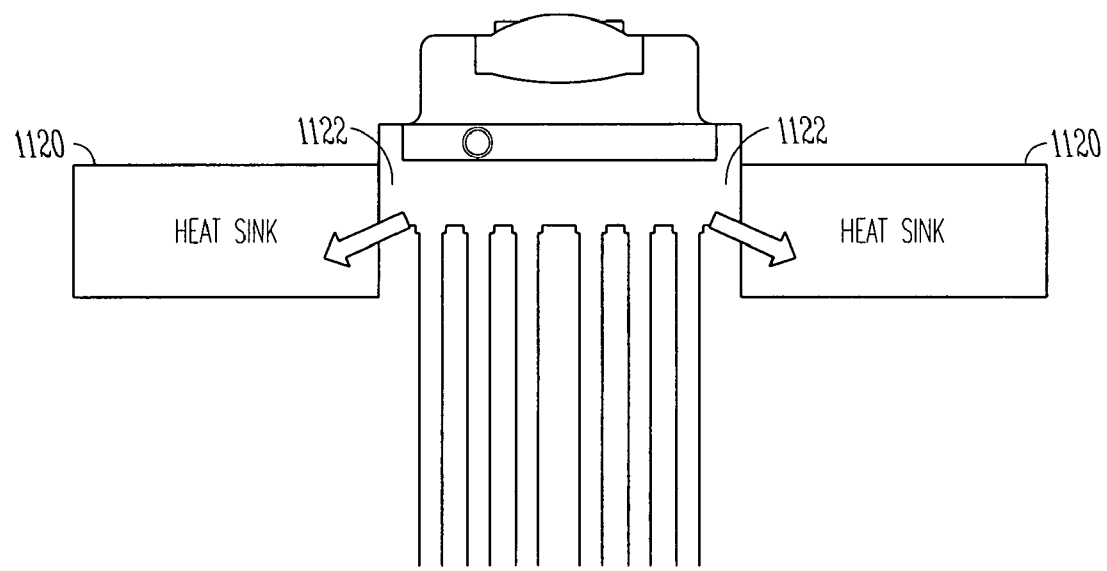
FIG. 16 illustrates multiple heat sinks placed in proximity to the optoelectronic package to remove heat from the optoelectronic package.

FIG. 16 illustrates multiple heat sinks 1120 placed in proximity to the optoelectronic package to remove heat from the optoelectronic package. In one embodiment, flat side walls 1122 of the insulating base 110 provide easy access for coupling the heat sinks to the optoelectronic package. In one embodiment, in order to use existing projection welding machines, the volume of insulating base is reduced to allow the metal frame to overhang the insulating base. However, maintaining a large insulating base is desirable to help with heat dissipation.

FIG. 17 illustrates in exploded view another embodiment of a metal frame 140 that overhangs the insulating base. In this example, the metal frame overhangs the insulating base in two directions by extending at least partially around two opposite side surfaces 1230 of the insulating base. To projection weld in this embodiment, a first electrode may be placed on the metal cap, and a second electrode may be placed on the bottom surfaces 1240 of the metal frame 140 that overhang the sides 1230 of the insulating base 110. The other two opposite sides 1250 of the insulating base 110 that are not blocked by an overhang of the metal frame 140 allow easy access for coupling the insulating base 110 with heat sinks (not shown).

Figure 18:
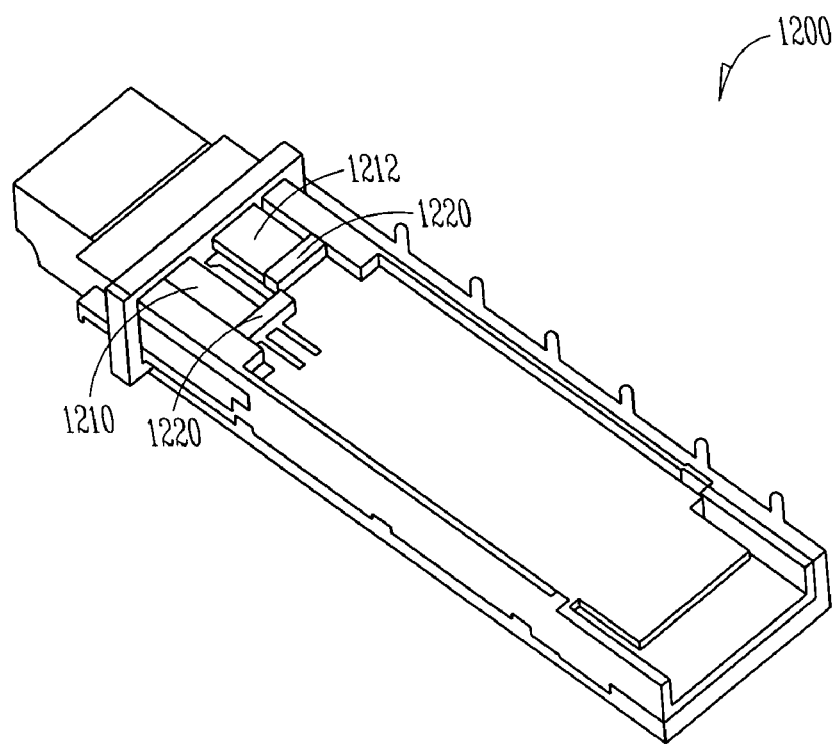
FIG. 18 is an example of a transponder housing for one or more TO cans.

FIG. 18 is an example of a transponder housing 1200 for one or more TO cans. In one embodiment, a first TO 1212 can serves as a receiver having a photodiode internally, and a second TO 1210 can serves as a transmitter having a light source, such as a laser diode, internally. In one embodiment, the TO cans have insulating bases 1220 with square edges that abut against the transponder housing such that the transponder housing serves as a heat sink for the TO cans. In another embodiment, the transponder housing may have a different contour shape, such as a curved shape, to match that of the TO cans.

Figure 20:
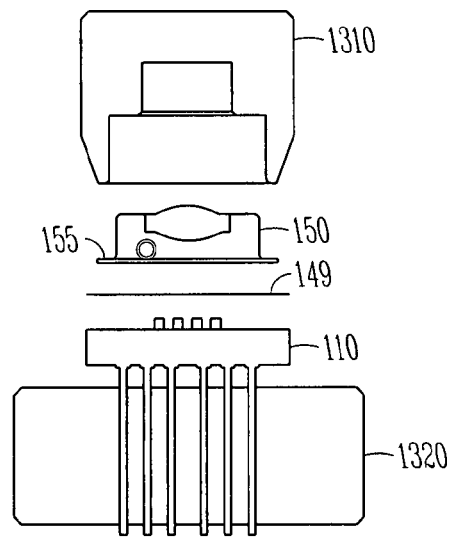
FIGS. 20–21 illustrate another example of a TO can embodiment that uses conductive vias similar to that described with respect to FIGS. 1–7 for hermetically sealing the TO can.
Figure 21:
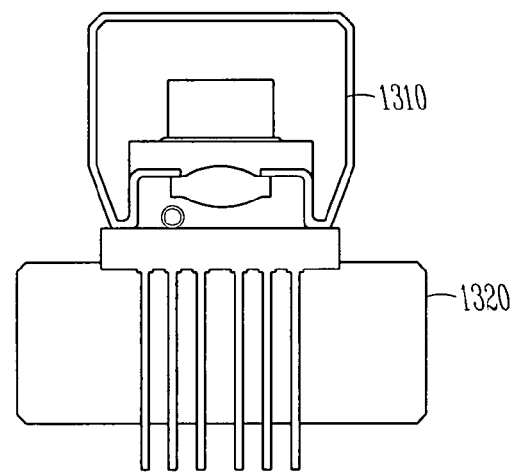

FIGS. 20–21 illustrate another example of a TO can embodiment that uses conductive vias similar to that described with respect to FIGS. 1–7 for hermetically sealing the TO can. FIG. 20 shows in exploded view a schematic diagram of the components of the TO can. In one embodiment, the top surface and the bottom surface of the insulating base 110 are metallized, and a metal contact member (not shown) may be attached to the lower metallized surface 130 as was described with respect to FIGS. 1–7. In this embodiment, however, a metal sealing member 140 is not employed. The metal cap 150 is placed onto a solder preform 149, such as AuSn, that is placed on the insulating base 110.

The metal cap 150 is projection welded onto the metallized top surface of the insulating base 110. Since the melting point of the solder preform is lower than that of steel, less welding current is needed. As a result, the heat in the conductive vias is reduced and the risk to break the insulating base is lowered. Since the heating is local, the same type of solder can be used inside the module.

The embodiment of FIG. 18 differs from that described with respect to FIGS. 1–7 in that a larger number of conductive vias 15 may be used, and the conductive vias may have a smaller diameter so that the resistance of the conductive vias is higher, and heats more readily. The rim 155 of the metal cap may be wider to provide a larger wetting surface for the solder interface, and the metal cap may lack the projection 157 shown in FIG. 19.

FIG. 21 shows first electrode 1310 and second electrode 1320 coupled to the TO can of FIG. 20. Whereas the embodiment of FIGS. 1–7 used a high current to meld the projection of the metal cap whose melting point may be over 1400 C, e.g., for steel, the solder preform may have a melting point around 300 C so a smaller current is used to melt the solder preform. The lower current is less likely to burn the material filling the conductive vias and break the insulating base, as may be an issue with the high currents for the embodiment of FIGS. 1–7. In the current embodiment, the conductive vias should be as dense as possible to provide uniform current density through the solder interface.

The optoelectronic package 100 of the present disclosure may be produced in an automated batch process that is similar to the batch processes used in manufacturing integrated circuits. A large wafer containing many complete optoelectronic packages 100 is fabricated and then cut into individual modules. The planarity of the upper surface 120 of the insulating base 110 enables placement of the optoelectronic elements using a high-precision pick-and-place machine equipped with two-dimensional (2D) machine vision. Using such automated pick-and-place techniques, the number of active alignments may be reduced. In addition, such a package may be manufactured inexpensively and in an automated method.

In sum, the optoelectronic package 100 of the present disclosure is advantageous in that it may be easily assembled in a small footprint wafer-scale assembly that reduces manufacturing materials, and which may be mass-produced at low cost. In addition, the package 100 integrates conventional "TO-style" metal caps 150 with an insulating base 110 having a relatively high degree of thermal conductivity so that the integrated circuit 220 may be mounted closer to its associated optical device 200 within the package 100. As a result, multiple optoelectronic packages 100 may be manufactured cost-effectively, while offering the simultaneous advantages of high-speed electrical operation, adaptability to batch processing, hermeticity, effective heat sinking, and high mechanical stability.

In the foregoing description, the disclosed structures and manufacturing methods have been described with reference to exemplary embodiments. It will, however, be evident that various modifications and changes may be made thereto without departing from the broader spirit and scope of this disclosure. The above specification and figures accordingly are to be regarded as illustrative rather than restrictive. It is therefore intended that the present disclosure be unrestricted by the foregoing description and drawings, except as may appear in the following appended claims.

What is claimed is:

1. A method of manufacturing an optoelectronic package having an insulating base with multiple conductive vias running through the insulating base, and having a metal cover that at least partially encloses an optoelectronic device mounted on the insulating base, the method comprising:
    placing a solder preform between the metal cover and the insulating base;
    applying pressure between the metal cover and the insulating base; and
    applying a current through the multiple conductive vias to heat the solder preform to melt.

2. The method of claim 1 further comprising:
    metalizing a top surface of the insulating base prior to the placing of the solder preform.

3. The method of claim 2, further comprising:
    allowing the solder preform to cool; and
    removing the pressure between the metal cover and the insulating base.

4. The method of claim 1, further comprising:
    allowing the solder preform to cool; and
    removing the pressure between the metal cover and the insulating base.

5. A method of manufacturing a TO can comprising:
    placing a solder preform between a metal cover and an insulating base; and
    applying a current to the solder preform until the solder preform melts to seal metal cover to the insulating base.

6. A method of manufacturing a TO can comprising:
    placing a solder preform between a metal cover and an insulating base; and
    applying a current to the solder preform until the solder preform melts to seal metal cover to the insulating base, wherein the current is applied through conductive vias running through the insulating base.

7. The method of claim 5, further comprising:
    creating a metallized surface on the insulating base, wherein placing the solder preform between the metal cover and the insulating base further comprises placing the solder preform in contact with the metallized surface.

8. A method of manufacturing an optoelectronic package having an insulating base with multiple conductive vias running through the insulating base, and having a metal cover with a transparent portion that at least partially encloses an optoelectronic device mounted on the insulating base, the method comprising:

aligning the transparent portion with a beam emergence side of an optoelectronic device;

placing a solder preform between the metal cover and the insulating base;

applying pressure between the metal cover and the insulating base; and applying a current through the multiple conductive vias to heat the solder preform to melt.

9. The method of claim 8 further comprising:
metalizing a top surface of the insulating base prior to the placing of the solder preform.

10. The method of claim 8, further comprising:
allowing the solder preform to cool; and
removing the pressure between the metal cover and the insulating base.

11. The method of claim 8, further comprising:
allowing the solder preform to cool; and
removing the pressure between the metal cover and the insulating base.

* * * * *

UNITED STATES PATENT AND TRADEMARK OFFICE
CERTIFICATE OF CORRECTION

PATENT NO.        : 7,223,629 B2
APPLICATION NO. : 10/732949
DATED             : May 29, 2007
INVENTOR(S)       : Zheng et al.

It is certified that error appears in the above-identified patent and that said Letters Patent is hereby corrected as shown below:

In column 14, line 57 (Approx.), in Claim 5, after "seal" insert -- the --.

In column 14, line 62 (Approx.), in Claim 6, after "seal" insert -- the --.

Signed and Sealed this

Sixth Day of November, 2007

JON W. DUDAS
*Director of the United States Patent and Trademark Office*